United States Patent
Kim et al.

(10) Patent No.: US 9,609,737 B2
(45) Date of Patent: Mar. 28, 2017

(54) HEAT DISSIPATION PRINTED CIRCUIT BOARD AND MANUFACTURING METHOD THEREOF

(71) Applicants: HYUNDAI MOTOR COMPANY, Seoul (KR); KIA MOTORS CORPORATION, Seoul (KR); YURA CORPORATION CO., LTD., Cheongju-si, Chungcheongbuk-do (KR)

(72) Inventors: Mun Jong Kim, Suwon-Si (KR); Kwan Bum Lee, Anyang-Si (KR); Jin Su Yeom, Anyang-Si (KR)

(73) Assignees: HYUNDAI MOTOR COMPANY, Seoul (KR); KIA MOTORS CORPORATION, Seoul (KR); YURA CORPORATION CO., LTD., Seongnam-si (KR)

( * ) Notice: Subject to any disclaimer, the term of this patent is extended or adjusted under 35 U.S.C. 154(b) by 205 days.

(21) Appl. No.: 14/516,487

(22) Filed: Oct. 16, 2014

(65) Prior Publication Data

US 2015/0181690 A1     Jun. 25, 2015

(30) Foreign Application Priority Data

Dec. 20, 2013   (KR) .................. 10-2013-0160439

(51) Int. Cl.
| | |
|---|---|
| *H05K 1/11* | (2006.01) |
| *H05K 1/00* | (2006.01) |
| *H05K 1/02* | (2006.01) |
| *H05K 1/09* | (2006.01) |

(Continued)

(52) U.S. Cl.
CPC ......... *H05K 1/0201* (2013.01); *H05K 1/0206* (2013.01); *H05K 1/09* (2013.01);
(Continued)

(58) Field of Classification Search
CPC .......... H05K 1/09; H05K 1/0201; H05K 3/06; H05K 3/067; H05K 3/445; H05K 3/4608; H05K 2201/0338; H05K 2201/09045
See application file for complete search history.

(56) References Cited

U.S. PATENT DOCUMENTS

| | | | | |
|---|---|---|---|---|
| 6,291,779 B1 * | 9/2001 | Lubert | ................ | H05K 3/0094 |
| | | | | 174/262 |
| 8,138,423 B2 * | 3/2012 | Watanabe | ............ | H05K 1/0265 |
| | | | | 174/252 |

(Continued)

FOREIGN PATENT DOCUMENTS

| | | |
|---|---|---|
| JP | 2819523 B2 | 10/1998 |
| JP | 3969477 B2 | 9/2007 |
| KR | 10-2009-0094983 A | 9/2009 |
| KR | 10-2010-00097913 A | 9/2010 |
| KR | 10-1308485 B1 | 9/2013 |

*Primary Examiner* — Hoa C Nguyen
(74) *Attorney, Agent, or Firm* — McDermott Will & Emery LLP

(57) ABSTRACT

A heat dissipation printed circuit board includes a metal core, lower and upper insulating layers, first lower and first upper circuit patterns, and second lower and second upper circuit patterns. The lower and upper insulating layers are disposed at a lower side and an upper side of the metal core, respectively. The first lower and first upper circuit patterns are disposed at a lower side of the lower insulating layer and at an upper side of the upper insulating layer, respectively. The second lower and second upper circuit patterns are disposed at a lower side of the first lower circuit pattern and at an upper side of the first upper circuit pattern, respectively. An etching portion in the first lower circuit pattern is filled with the lower insulating layer and an etching portion in the first upper circuit pattern is filled with the upper insulating layer.

8 Claims, 3 Drawing Sheets

(51) Int. Cl.
  *H05K 3/00* (2006.01)
  *H05K 3/06* (2006.01)
  *H05K 3/44* (2006.01)
  *H05K 3/46* (2006.01)

(52) U.S. Cl.
  CPC .......... *H05K 3/0097* (2013.01); *H05K 3/067* (2013.01); *H05K 3/44* (2013.01); *H05K 3/445* (2013.01); *H05K 3/4608* (2013.01); *H05K 3/06* (2013.01); *H05K 2201/0338* (2013.01); *H05K 2201/09045* (2013.01); *H05K 2203/0278* (2013.01); *Y10T 29/4916* (2015.01); *Y10T 29/49155* (2015.01); *Y10T 29/49165* (2015.01)

(56) References Cited

U.S. PATENT DOCUMENTS

| | | | |
|---|---|---|---|
| 2008/0041621 A1* | 2/2008 | Hsu | H05K 3/465 174/262 |
| 2010/0002406 A1* | 1/2010 | Hsu | H01L 23/49822 361/764 |
| 2011/0088937 A1* | 4/2011 | Ko | H05K 3/4602 174/261 |
| 2011/0232085 A1* | 9/2011 | Muramatsu | H05K 3/0032 29/852 |
| 2013/0319734 A1* | 12/2013 | Shin | H01L 23/142 174/255 |

* cited by examiner

HEAT DISSIPATION PRINTED CIRCUIT BOARD AND MANUFACTURING METHOD THEREOF

CROSS-REFERENCE TO RELATED APPLICATION

This application claims benefit of priority to Korean Patent Application No. 10-2013-0160439 filed in the Korean Intellectual Property Office on Dec. 20, 2013, the entire contents of which are incorporated herein by reference.

TECHNICAL FIELD

The present inventive concept relates to a heat dissipation printed circuit board and a manufacturing method. More particularly, the present inventive concept relates to a heat dissipation printed circuit board and a manufacturing method that can improve heat dissipation characteristics.

BACKGROUND

Generally, a conductive pattern is formed in a printed circuit board (PCB) according to a designed circuit pattern, such that high temperature heat is dissipated according to the conductive pattern and parts mounted or installed in the PCB. However, an error, such as malfunction or breakage, occurs in a circuit when high temperature heat at more than a predetermined level is generated from the parts mounted or installed in the PCB. Therefore, a printed circuit board with a copper core formed therein and a circuit pattern formed of copper has been proposed in order to dissipate the high temperature heat generated from the parts mounted or installed in the PCB. However, the PCB including the copper core has a problem that weight of the PCB and cost are increased. Therefore, a PCB with an aluminum core formed therein and a circuit pattern formed of aluminum is being developed. However, the PCB including the aluminum core has a problem that the circuit pattern is over-etched in etching processes when forming the circuit pattern.

The above information disclosed in this Background section is only for enhancement of understanding of the background of the inventive concept and therefore it may contain information that does not constitute the prior art that is already known.

SUMMARY

The present inventive concept has been made in an effort to provide a heat dissipation printed circuit board that can ensure product quality, reduce weight of a PCB, and reduce manufacturing cost through minimization of over-etching.

One aspect of the present inventive concept relates to a heat dissipation printed circuit board including a metal core, a lower insulating layer disposed at a lower side of the metal core and an upper insulating layer disposed at an upper side of the metal core, a first lower circuit pattern disposed at a lower side of the lower insulating layer and a first upper circuit pattern disposed at an upper side of the upper insulating layer, and a second lower circuit pattern disposed at a lower side of the first lower circuit pattern and a second upper circuit pattern disposed at an upper side of the first upper circuit pattern. An etching portion in the first lower circuit pattern is filled with the lower insulating layer and an etching portion in the first upper circuit pattern is filled with the upper insulating layer. The second lower circuit pattern and the first lower circuit pattern may have the same pattern as each other, and the second upper circuit pattern and the first upper circuit pattern may have the same pattern as each other.

The lower insulating layer may cover a lateral side of the etching portion of the first lower circuit pattern, and the upper insulating layer may cover a lateral side of the etching portion of the first upper circuit pattern.

The heat dissipation printed circuit board according to an aspect of the present inventive concept may further include a through hole and an inside metal layer. The through hole penetrates the metal core, the lower insulating layer, the upper insulating layer, the first lower circuit pattern, and the first upper circuit pattern. The inside metal layer covers a lateral side of the metal core, the lower insulating layer, the upper insulating layer, the first lower circuit pattern, and the first upper circuit pattern exposed by the through hole.

The metal core, the first lower circuit pattern, and the first upper circuit pattern may include aluminum.

The second lower circuit pattern, the second upper circuit pattern, and the inside metal layer may include copper.

Another aspect of the present inventive concept encompasses a manufacturing method of a heat dissipation printed circuit board including plating a second lower layer and a second upper layer with a first lower plate and a first upper plate, respectively. The first lower plate faces the first upper plate. A first lower circuit pattern and a first upper circuit pattern are formed by patterning the first lower plate and the first upper plate, respectively. A metal core, a lower insulating layer, and an upper insulating layer are formed between the first lower circuit pattern and the first upper circuit pattern. A second lower circuit pattern and a second upper circuit pattern are formed by patterning the second lower layer and the second upper layer, respectively.

In the forming the metal core, the lower insulating layer and the upper insulating layer, the metal core may be inserted between the first lower circuit pattern and the first upper circuit pattern, the lower insulating layer may be filled between the first lower circuit pattern and the metal core, the upper insulating layer may be filled between the first upper circuit pattern and the metal core, and the metal core, the lower insulating layer, and the upper insulating layer may be heated and pressed.

In the heating and pressing the metal core, the lower insulating layer, and the upper insulating layer, an etching portion formed in the lower insulating layer may be filled with the lower insulating layer, and an etching portion formed in the upper insulating layer may be filled with the upper insulating layer.

The lower insulating layer may cover a lateral side of the first lower circuit pattern and the upper insulating layer may cover a lateral side of first upper circuit pattern.

The manufacturing method of a heat dissipation printed circuit board may further include, after forming the metal core, the lower insulating layer, and the upper insulating layer, forming a through hole penetrating the metal core, the lower insulating layer, the upper insulating layer, the first lower circuit pattern, and the first upper circuit pattern; and forming an inside metal layer covering lateral sides of the metal core, the lower insulating layer, and the upper insulating layer exposed by the through hole.

The metal core, the first lower circuit pattern, and the first upper circuit pattern may include aluminum.

The first lower circuit pattern and the first upper circuit pattern may be formed with an alkali etchant.

The second lower circuit pattern, the second upper circuit pattern, and the inside metal layer may include copper.

The inside metal layer and the lower insulating layer may cover the first lower circuit pattern such that the first lower circuit pattern is not be exposed to the outside of the heat dissipation printed circuit board.

The inside metal layer and the upper insulating layer may cover the first upper circuit pattern such that the first upper circuit pattern is not be exposed to the outside of the heat dissipation printed circuit board.

According to an aspect of the present inventive concept, since an etching portion formed in a first lower circuit pattern is filled with a lower insulating layer and an etching portion formed in a first upper circuit pattern is filled with an upper insulating layer, the first lower circuit pattern and the first upper circuit pattern are not exposed to the outside. Therefore, the first lower circuit pattern and the first upper circuit pattern can be protected from an etchant used for a patterning process of the second lower circuit pattern and the second upper circuit pattern.

Further, since a metal core, a first lower circuit pattern, and a first upper circuit pattern of a heat dissipation printed circuit board are formed of aluminum, weight of the PCB and manufacturing cost are reduced and heat dissipation is maximized.

DETAILED DESCRIPTION

Figure 1:
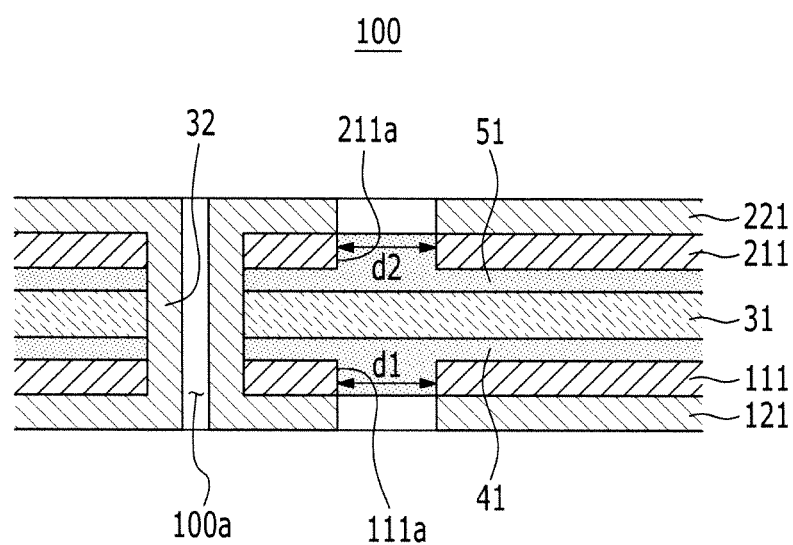
FIG. 1 is a cross-sectional view of a heat dissipation printed circuit board according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In describing the present inventive concept, parts that are not related to the description will be omitted. Like reference numerals generally designate like elements throughout the specification.

In addition, the magnitude and thickness of each configuration shown in the drawings are arbitrarily shown for better understanding and ease of description, but the present inventive concept is not limited thereto. In the drawings, the thickness of layers, films, panels, regions, etc., are exaggerated for clarity.

FIG. 1 is a cross-sectional view of a heat dissipation printed circuit board according to an exemplary embodiment of the present inventive concept.

As shown in FIG. 1, a heat dissipation printed circuit board 100 according to an exemplary embodiment of the present inventive concept may include a metal core 31, a lower insulating layer 41, a first lower circuit pattern 111, and a second lower circuit pattern 121, sequentially disposed at a lower side of the metal core 31. The a heat dissipation printed circuit board 100 may further include an upper insulating layer 51, a first upper circuit pattern 211, and a second upper circuit pattern 221, sequentially disposed at an upper side of the metal core 31. A through hole 100a penetrating the metal core 31, the lower insulating layer 41, the upper insulating layer 51, the first lower circuit pattern 111, and the first upper circuit pattern 211 may be formed in the heat dissipation printed circuit board 100. An inside metal layer 32 may be formed on an inner wall of the through hole 100a.

The metal core 31, the first lower circuit pattern 111, and the first upper circuit pattern 211 may be formed of aluminum in order to minimize weight of the printed circuit board 100 and maximize heat dissipation.

The lower insulating layer 41 may insulate the metal core 31 from the first lower circuit pattern 111, and the upper insulating layer 51 may insulate the metal core 31 from the first upper circuit pattern 211.

The lower insulating layer 41 may fill an etching portion d1 formed in the first lower circuit pattern 111, and the upper insulating layer 51 may fill an etching portion formed in the first upper circuit pattern 211. The lower insulating layer 41 may cover a lateral side 111a of the first lower circuit pattern 111, and the upper insulating layer 51 may cover a lateral side 211a of the first upper circuit pattern 211.

Therefore, the first lower circuit pattern 111 and the first upper circuit pattern 211 may not be exposed to the outside, such that the first lower circuit pattern 111 and first upper circuit pattern 211 are protected from an etchant used for forming the second lower circuit pattern 121 and the second upper circuit pattern 221.

The second lower circuit pattern 121 and the first lower circuit pattern 111 may be formed with the same pattern as each other, and the second upper circuit pattern 221 and the first upper circuit pattern 211 may be formed with the same pattern as each other. The second lower circuit pattern 121 and the second upper circuit pattern 221 may be formed of a material having high electrical conductivity, e.g., copper, in order to improve the low electrical conductivity of the first lower circuit pattern 111 and the first upper circuit pattern 211, which include a material having relatively low electrical conductivity, e.g., aluminum.

The inside metal layer 32 may cover lateral sides (e.g., 211a) of the metal core 31, the lower insulating layer 41, the upper insulating layer 51, the first lower circuit pattern 111, and the first upper circuit pattern 211 exposed by an inner wall of the through hole 100a. Since the inside metal layer 32 is made of the same material as the second lower circuit pattern 121 and the second upper circuit pattern 221, the first lower circuit pattern 111 disposed at the lower side of the printed circuit board 100 and the first upper circuit pattern 211 disposed at the upper side of the printed circuit board 100 may be electrically connected to each other.

The second lower circuit pattern 121, the second upper circuit pattern 221, and the inside metal layer 32 may be made of copper in order to maximize heat dissipation.

Hereinafter, a manufacturing method of the heat dissipation printed circuit board according to an exemplary embodiment of the present inventive concept will be described in detail with reference to accompanied drawings.

FIG. 2 to FIG. 6 are cross-sectional views sequentially illustrating a manufacturing method of heat dissipation printed circuit board according to an exemplary embodiment of the present inventive concept.

Figure 2:
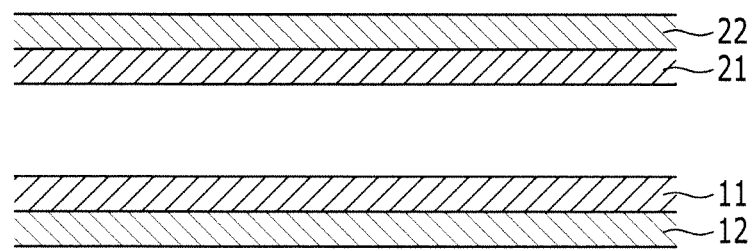
FIGS. 2-6 are cross-sectional views sequentially illustrating a manufacturing method of a heat dissipation printed circuit board according to an exemplary embodiment of the present inventive concept.

As shown in FIG. 2, a first lower plate 11 may face, and be separated from, a first upper plate 21. The first lower plate 11 and the first upper plate 21 may be made of aluminum. A second lower layer 12 may be plated with the first lower plate 11, and the second upper layer 22 may be plated with the first upper plate 21. Therefore, the second lower layer 12 made of copper may be plated to a lower side of the first lower plate 11, and the second upper layer 22 made of copper may be plated to a upper side of the first upper plate 21.

In order to protect the first lower plate 11 and the first upper plate 21 made of aluminum from being etched by a copper plating solution, a zincate method of processing copper plating after substituting zinc for aluminum may be used.

Figure 3:
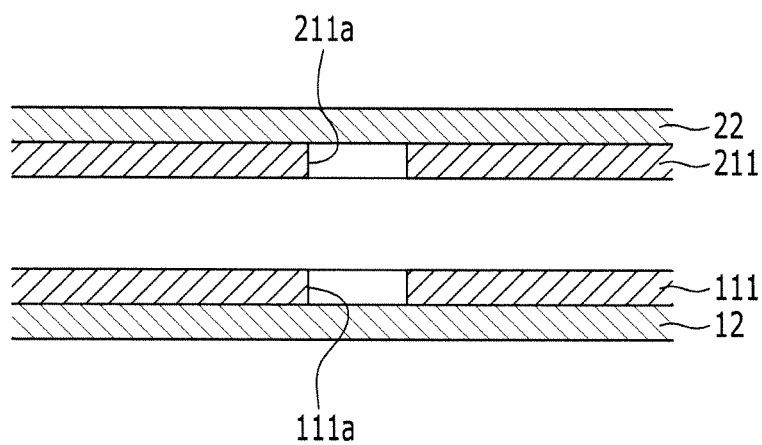

As shown in FIG. 3, the first lower plate 11 and the first upper plate 21 may be patterned by using an alkali etchant such that the first lower circuit pattern 111 and the first upper circuit pattern 211 are formed. Since an etching speed of aluminum is faster than an etching speed of copper by about 600%, when the first lower plate 11 and the first upper plate 21 made of aluminum and the second lower layer 12 and the second upper layer 22 made of copper are simultaneously etched, the first lower plate 11 and the first upper plate 21 may be over-etched. Therefore, the first lower plate 11 and the first upper plate 21 may be etched by using an alkali etchant that can only etch aluminum. The alkali etchant that may be used is a mixed solution of sodium hydroxide (NaOH) and sodium carbonate ($NaCO_3$).

Figure 4:
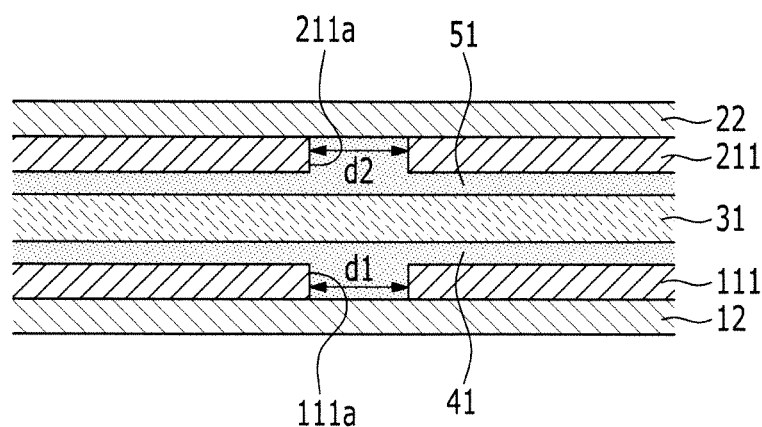

As shown in FIG. 4, the metal core 31 made of aluminum may be inserted between the first lower circuit pattern 111 and the first upper circuit pattern 211. The lower insulating layer 41 may be filled between the first lower circuit pattern 111 and the metal core 31 by using a prepreg, and the upper insulating layer 51 may be filled between the first upper circuit pattern 211 and the metal core 31 by using a prepreg.

The metal core 31, the lower insulating layer 41, and the upper insulating layer 51 may be heated and pressed. At this time, the etching portion d1 of the first lower circuit pattern 111 may be filled with the lower insulating layer 41, and the etching portion d2 of the first upper circuit pattern 211 may be filled with the upper insulating layer 51. The lateral side 111a of the first lower circuit pattern 111 and the lateral side 211a of the first upper circuit pattern 211 may be respectively covered by the lower insulating layer 41 and the upper insulating layer 51. Therefore, the first lower circuit pattern 111 and the first upper circuit pattern 211 may not be exposed to the outside.

Figure 5:
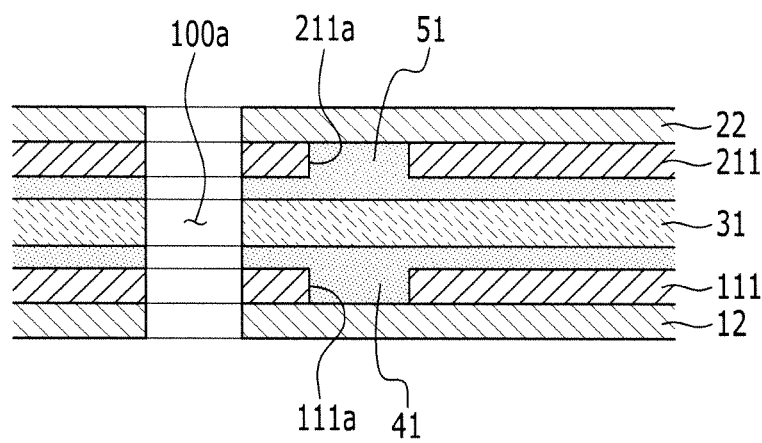

As shown in FIG. 5, the through hole 100a penetrating the metal core 31, the lower insulating layer 41, the upper insulating layer 51, the first lower circuit pattern 111, and the first upper circuit pattern 211 may be formed.

Figure 6:
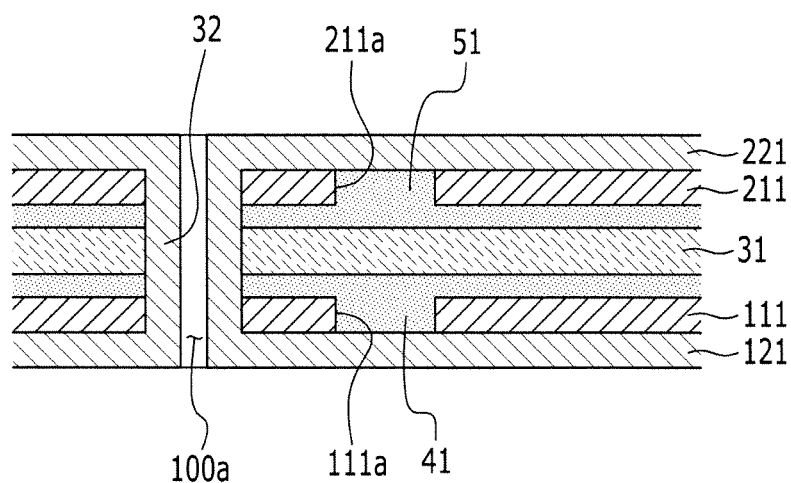

As shown in FIG. 6, the inside metal layer 32 covering lateral sides of the metal core 31, the lower insulating layer 41, and the upper insulating layer 51 exposed by the through hole 100a may be made of copper by a zincate method.

As shown in FIG. 1, the second lower layer 12 and the second upper layer 22 may be respectively patterned by a copper etchant, such that the second lower circuit pattern 121 and the second upper circuit pattern 221 are formed. At this time, since the first lower circuit pattern 111 and the first upper circuit pattern 211 are not exposed to the outside, the first lower circuit pattern 111 and the first upper circuit pattern 211 can be protected from the copper etchant for patterning the second lower circuit pattern 121 and the second upper circuit pattern 221. The copper etchant may be ferric chloride.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A heat dissipation printed circuit board, comprising:
a metal core;
a lower insulating layer disposed at a lower side of the metal core and an upper insulating layer disposed at an upper side of the metal core;
a first lower circuit pattern disposed at a lower side of the lower insulating layer and a first upper circuit pattern disposed at an upper side of the upper insulating layer;
a second lower circuit pattern disposed at a lower side of the first lower circuit pattern and a second upper circuit pattern disposed at an upper side of the first upper circuit pattern;
a through hole penetrating the metal core, the lower insulating layer, the upper insulating layer, the first lower circuit pattern, and the first upper circuit pattern; and
an inside metal layer covering lateral sides of the metal core, the lower insulating layer, the upper insulating layer, the first lower circuit pattern, and the first upper circuit pattern exposed by the through hole,
wherein an etched portion in the first lower circuit pattern is filled with the lower insulating layer and an etched portion in the first upper circuit pattern is filled with the upper insulating layer, and
the lower insulating layer covers a lateral side of the etched portion of the first lower circuit pattern and the upper insulating layer covers a lateral side of the etched portion of the first upper circuit pattern.

2. The heat dissipation printed circuit board of claim 1, wherein:
the second lower circuit pattern and the first lower circuit pattern have the same pattern as each other, and
the second upper circuit pattern and the first upper circuit pattern have the same pattern as each other.

3. The heat dissipation printed circuit board of claim 1, wherein the metal core, the first lower circuit pattern, and the first upper circuit pattern include aluminum.

4. The heat dissipation printed circuit board of claim 1, wherein the second lower circuit pattern, the second upper circuit pattern, and the inside metal layer include copper.

5. The heat dissipation printed circuit board of claim 1, wherein the inside metal layer and the lower insulating layer cover the first lower circuit pattern such that the first lower circuit pattern is not be exposed to the outside of the heat dissipation printed circuit board.

6. The heat dissipation printed circuit board of claim 1, wherein the inside metal layer and the upper insulating layer cover the first upper circuit pattern such that the first upper circuit pattern is not be exposed to the outside of the heat dissipation printed circuit board.

7. The heat dissipation printed circuit board of claim 1, wherein the first lower circuit pattern and a portion of the inside metal layer located at a level between the lower side and an upper side of the first lower circuit pattern are formed of different materials.

8. The heat dissipation printed circuit board of claim 1, wherein the first upper circuit pattern and a portion of the inside metal layer located at a level between the upper side and a lower side of the first upper circuit pattern are formed of different materials.

* * * * *